United States Patent
Rivero et al.

(10) Patent No.: US 10,049,991 B2
(45) Date of Patent: Aug. 14, 2018

(54) METHOD FOR FORMING AT LEAST ONE ELECTRICAL DISCONTINUITY IN AN INTERCONNECTION PART OF AN INTEGRATED CIRCUIT, AND CORRESPONDING INTEGRATED CIRCUIT

(71) Applicant: STMicroelectronics (Rousset) SAS, Rousset (FR)

(72) Inventors: Christian Rivero, Rousset (FR); Pascal Fornara, Pourrieres (FR); Guilhem Bouton, Peynier (FR); Mathieu Lisart, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/596,772

(22) Filed: May 16, 2017

(65) Prior Publication Data
US 2018/0145039 A1 May 24, 2018

(30) Foreign Application Priority Data
Nov. 22, 2016 (FR) ...................... 16 61348

(51) Int. Cl.
*H01L 23/522* (2006.01)
*H01L 21/70* (2006.01)
(Continued)

(52) U.S. Cl.
CPC .............. *H01L 23/57* (2013.01); *H01L 21/56* (2013.01); *H01L 21/76877* (2013.01);
(Continued)

(58) Field of Classification Search
CPC ........... H01L 23/5226; H01L 21/76877; H01L 23/481; H01L 23/528; H01L 23/5283;
(Continued)

(56) References Cited

U.S. PATENT DOCUMENTS 6,791,191 B2    9/2004   Chow et al.
7,402,514 B2 *  7/2008   Tsu .................. H01L 21/76807
                                           257/E21.579
(Continued)

FOREIGN PATENT DOCUMENTS

DE        69715472 T2     4/2003
DE     102013224060 A1    5/2015
(Continued)

OTHER PUBLICATIONS

INPI Search Report and Written Opinion for FR 1661348 dated Oct. 3, 2017 (7 pages).

*Primary Examiner* — Jasmine Clark
(74) *Attorney, Agent, or Firm* — Crowe & Dunlevy

(57) ABSTRACT

An integrated circuit includes an interconnection part with a via level situated between a lower metallization level and an upper metallization level. The lower metallization level is covered by an insulating encapsulation layer. An electrical discontinuity between a first via of the via level and a first metal track of the lower metallization level is provided at the level of the insulating encapsulation layer. The electrical discontinuity is formed prior to formation of any via of the via level and prior to any metal track of the upper metallization level. The electrical discontinuity may comprise: a portion of an additional insulating layer extending over the insulating encapsulation layer; a portion of the insulating encapsulation layer; or an insulating oxide on a top surface of the first metal track.

10 Claims, 4 Drawing Sheets

(51) Int. Cl.
 *H01L 21/768* (2006.01)
 *H01L 23/52* (2006.01)
 *H01L 23/00* (2006.01)
 *H01L 23/28* (2006.01)
 *H01L 23/528* (2006.01)
 *H01L 21/56* (2006.01)

(52) U.S. Cl.
 CPC ............ *H01L 23/28* (2013.01); *H01L 23/528* (2013.01); *H01L 23/5226* (2013.01)

(58) Field of Classification Search
 CPC ... H01L 21/76843; H01L 23/28; H01L 24/03; H01L 21/76802; H01L 21/56
 See application file for complete search history.

(56) References Cited

U.S. PATENT DOCUMENTS

| | | |
|---|---|---|
| 9,502,405 B1 | 11/2016 | Cao et al. |
| 2008/0174022 A1 | 7/2008 | Chen et al. |
| 2008/0293242 A1* | 11/2008 | Cooney, III ...... H01L 21/76808 438/656 |
| 2009/0111257 A1 | 4/2009 | Hsu et al. |
| 2010/0155846 A1 | 6/2010 | Mukherjee et al. |
| 2016/0254227 A1 | 9/2016 | Leobandung |

FOREIGN PATENT DOCUMENTS

| | | |
|---|---|---|
| JP | S61147551 A | 7/1986 |
| JP | 2008205019 A | 9/2008 |
| WO | WO-9857373 A1 | 12/1998 |

* cited by examiner

METHOD FOR FORMING AT LEAST ONE ELECTRICAL DISCONTINUITY IN AN INTERCONNECTION PART OF AN INTEGRATED CIRCUIT, AND CORRESPONDING INTEGRATED CIRCUIT

PRIORITY CLAIM

This application claims the priority benefit of French Application for Patent No. 1661348, filed on Nov. 22, 2016, the disclosure of which is hereby incorporated by reference in its entirety.

TECHNICAL FIELD

Embodiments and their implementations relate to integrated circuits and, more particularly, to their protection against "reverse engineering" carried out based on photographic top views of various layers of the integrated circuit.

BACKGROUND

There is a need in the art for an integrated circuit whose structure and method of fabrication render an automatic pattern recognition used during reverse engineering complicated, or even virtually impossible, notably by increasing the rate of extraction errors so as to render virtually impossible the extraction of the description (or "netlist") of the integrated circuit based on a view from below of the layout.

SUMMARY

In an embodiment, the formation of at least one electrical discontinuity is in particular provided in the interconnection part (commonly denoted by those skilled in the art using the acronym BEOL: "Back End Of Line") of the integrated circuit and, more particularly, between at least one via of a via level, separating a lower metallization level from an upper metallization level, and at least one metal track from said lower metallization level.

The interconnection part (BEOL) is situated on top of a substrate of the integrated circuit. Consequently, the lower metallization level is understood to mean a metallization level which is situated closer to the substrate than the upper metallization level.

Thus, according to one aspect, a method is provided for forming at least one electrical discontinuity in at least one via level situated between a lower metallization level and an upper metallization level of an interconnection part of an integrated circuit, comprising the formation of the lower metallization level covered by an insulating encapsulation layer, and the formation of said at least one electrical discontinuity between at least a first via of said via level and at least a first track of said lower metallization level at the level of said encapsulation layer, prior to the formation of other vias of the via level and of the metal tracks of the upper metallization level.

Thus, such an electrical discontinuity, formed at the level of the encapsulation layer, of the lower metallization level under a via is almost, or even totally, non-detectable by a photographic view from above and allows, for example, the pretense, when the metal track situated opposite the via having this electrical discontinuity is, for example, connected to an electric circuit, of the electric circuit being operational (for example, with connection to a drain region of a transistor, the pretense that this transistor is electrically functional whereas it is permanently OFF, in other words functionally inactive, owing to the presence of this discontinuity).

Several variants are possible for forming this or these electrical discontinuities.

Thus, according to a first variant, the formation of each electrical discontinuity comprises: the formation, at the location of each first via, of an orifice passing through said encapsulation layer and extending into a part of each corresponding underlying first metal track; the formation of a first insulating layer covering said encapsulation layer and coating the internal wall and the bottom of each orifice in such a manner as to form the corresponding electrical discontinuity; the formation, on said first insulating layer, of a second insulating layer; and the formation, within the second insulating layer, the first insulating layer and the encapsulation layer, of all the vias of the via level and of all the metal tracks of the upper metallization level, each first via being separated from each corresponding first track by the corresponding electrical discontinuity, whereas the other vias come into electrical contact with the corresponding tracks of the lower metallization level.

However, although perfectly feasible, such a variant proves to be quite difficult to implement because it requires special precautions to be taken in the process of fabrication in such a manner as to avoid penetrating the first insulating layer which provides the electrical discontinuity.

Thus, according to another variant, more robust in terms of fabrication process, the formation of each electrical discontinuity comprises: the formation, on said encapsulation layer, of an inter-metallization level insulating layer (generally known by those skilled in the art under the acronym IMD for "Inter-Metal Dielectric"); the formation, within said inter-metallization level insulating layer, of orifices designed to receive all the vias of the via level and all the metal tracks of the upper metallization level and opening out onto said encapsulation layer; a localized etching of said encapsulation layer through said orifices with the exception of each first part of this layer situated at the location of each first via, each first part forming the corresponding electrical discontinuity; and filling of said orifices with at least one electrically-conductive filler material in such a manner as to form all the vias of the via level and all the metal tracks of the upper metallization level, each first via being separated from each corresponding first track by the corresponding electrical discontinuity.

According to yet another possible variant, the formation of each electrical discontinuity comprises: a localized etch, at the location of each first via, of a first corresponding part of said encapsulation layer in such a manner as to uncover a second corresponding part of a corresponding underlying metal track; an oxidation of each second part in such a manner as to cover each second part with a corresponding insulating layer of metal oxide and to form said corresponding electrical discontinuity; formation, on said encapsulation layer and on each insulating layer of metal oxide, of an inter-metallization level insulating layer; formation, within said inter-metallization level insulating layer, of orifices designed to receive all the vias of the via level and all the metal tracks of the upper metallization level and all opening out onto said encapsulation layer with the exception of each orifice designed to receive the corresponding first via which opens out onto the corresponding insulating layer of metal oxide; and filling of all the orifices with at least one electrically-conductive filler material in such a manner as to form all the vias of the via level and all the metal tracks of the upper metallization level, each first via being separated from the corresponding first track by the corresponding electrical discontinuity.

According to another aspect, an integrated circuit is provided comprising an interconnection part comprising at least one via level situated between a lower metallization level covered by an insulating encapsulation layer and an upper metallization level, and at least one electrical discontinuity between at least a first via of said via level and at least a first track of said lower metallization level, situated at the level of said encapsulation layer.

According to one embodiment, the integrated circuit comprises, at the location of each first via, an orifice passing through said encapsulation layer and extending into a part of each corresponding underlying first metal track, the internal wall and the bottom of said orifice being coated with a first insulating layer, each first via being separated from each corresponding first track by a corresponding part of the first insulating layer forming the corresponding electrical discontinuity, whereas the other vias of the via level are in electrical contact with the corresponding tracks of the lower metallization level through said encapsulation layer.

According to another embodiment, each first via is separated from each corresponding first track by a first corresponding part of the encapsulation layer forming the corresponding electrical discontinuity, whereas the other vias of the via level are in electrical contact with the corresponding tracks of the lower metallization level through said encapsulation layer.

According to yet another embodiment, the integrated circuit comprises, at the location of each first via, a region of interruption of the encapsulation layer, filled by an insulating layer of metal oxide covering a second corresponding part of a corresponding underlying metal track, each first via being separated from the corresponding first track by the corresponding insulating layer of metal oxide forming the corresponding electrical discontinuity, whereas the other vias of the via level are in electrical contact with the corresponding tracks of the lower metallization level through said encapsulation layer.

According to another aspect, an object is provided, for example a smartcard or an electronic device, such as for example a cellular mobile telephone or a tablet, comprising an integrated circuit such as defined hereinbefore.

BRIEF DESCRIPTION OF THE DRAWINGS

Other advantages and features of the invention will become apparent upon examining the detailed description of embodiments and their implementations, which are in no way limiting, and from the appended drawings, in which.

DETAILED DESCRIPTION

Figure 1:
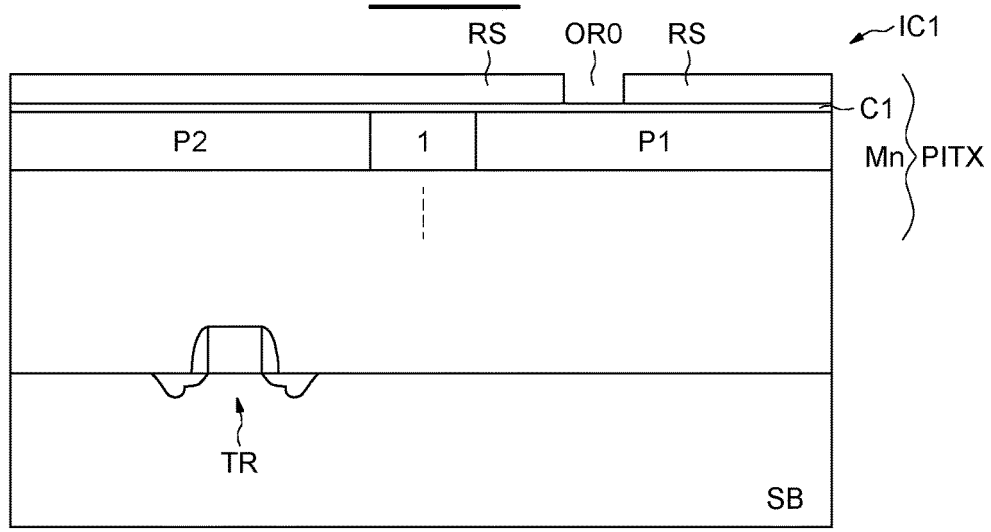
FIGS. 1 to 4 illustrate schematically a first embodiment and implementation.

In FIG. 1, the reference IC1 denotes an integrated circuit the semiconductor substrate SB of which has been shown here schematically, within and on which components are fabricated comprising for example transistors TR.

The integrated circuit IC1 comprises, on top of the substrate, an interconnection part PITX (BEOL) generally comprising several metallization levels, together with several via levels between these metallization levels.

In FIG. 1, for the sake of simplicity, only one metallization level Mn has been shown which, in the following, will be denoted as a lower metallization level.

This lower metallization level Mn has been formed in a conventional manner and comprises metal tracks P1, P2 encapsulated within an inter-track dielectric material 1.

The metallization level Mn is covered by an insulating encapsulation layer C1, for example of silicon carbonitride (SiCN).

As illustrated in FIG. 1, a resist mask RS is formed on the layer C1 having an orifice OR0 which will allow, as will be seen hereinafter, an electrical discontinuity to be formed at the level of a first via.

Figure 2:
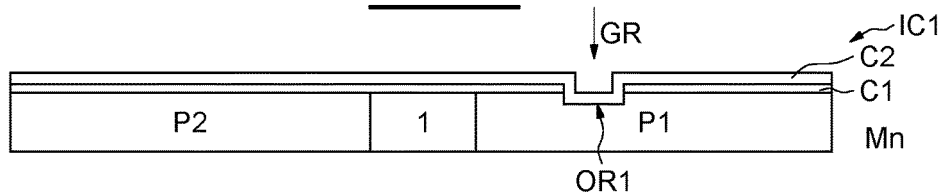
Figure 3:
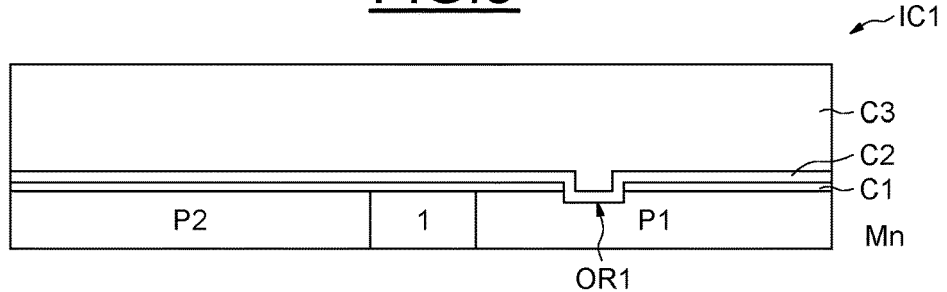
Figure 4:
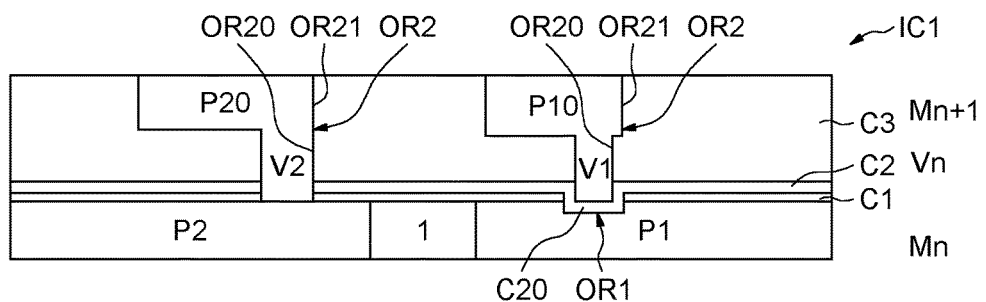

In FIGS. 2 to 4, the substrate SB of the integrated circuit IC1 has not been shown for the sake of simplicity and only a portion of the interconnection part PITX has been shown.

As illustrated in FIG. 2, an orifice OR1 is etched through the orifice OR0, passing through the encapsulation layer C1 and extending into a part of the underlying first metal track P1 of the lower metallization level Mn.

Then, a first insulating layer C2 is deposited on this structure covering the encapsulation layer C1 and coating the internal wall and the bottom of the orifice OR1.

This first insulating layer C2 may, for example, comprise tetra-orthosilicate of silicon (TEOS).

Then, as illustrated in FIG. 3, a second insulating layer C3, which may also be of TEOS or else comprise a material with low dielectric constant, for example of the SiOC type, is formed, for example by deposition, on the first insulating layer C2.

This insulating layer C3 is an inter-metallization level insulating layer and is generally known by those skilled in the art under the acronym IMD ("Inter Metal Dielectric").

Then, as illustrated in FIG. 4, in the second insulating layer C3, the first insulating layer C2, orifices OR2 each comprising a part OR21 designed to receive a metal track of the upper metallization level Mn+1 and a lower part OR20 designed to receive a via of the via level Vn are formed by etching.

However, as can be seen in FIG. 4, whereas the orifice OR20 of the left-hand part of FIG. 4 penetrates the encapsulation layer C1 to open out onto the top surface of the underlying metal track P2, the orifice OR20 of the right-hand part of FIG. 4 does not open out onto the underlying metal part P1 owing to the presence of the orifice OR1 coated with the first insulating layer C2.

For this purpose, the depth of the orifice OR1 has been chosen so as to avoid penetrating through this first insulating layer C2 during the conventional fabrication of the orifices OR20.

Those skilled in the art will know how to choose the value of this depth as a function of the technology used.

The orifices OR2 are subsequently filled in a conventional manner by at least one filler metal, for example copper, in such a manner as to form the tracks P10 and P20 of the upper metallization level Mn+1, together with the vias V1 and V2 of the via level Vn.

However, it can be seen that the part C20 of the second insulating layer C2 situated in the orifice OR1 forms an electrical discontinuity between the first via V1 and the underlying metal track P1.

Moreover, this electrical discontinuity C20 has been formed prior to the formation of all the vias and of all the metal tracks of the upper metallization level.

Thus, as illustrated in FIG. 4, an integrated circuit is obtained comprising, at the location of each first via V1, an orifice OR1 passing through the encapsulation layer C1 and extending into a part of the corresponding underlying first metal track P1.

The internal wall and the bottom of the orifice OR1 are coated with the first insulating layer C2.

Furthermore, the first via V1 is separated from the corresponding track P1 by a corresponding part C20 of the first insulating layer forming the corresponding electrical discontinuity, whereas the other vias V2 of the via level are in electrical contact with the corresponding tracks P2 of the lower metallization level through the encapsulation layer C1. However, this variant embodiment proves to be quite difficult to implement in terms of fabrication process in order to avoid penetrating the insulating layer C20 during the fabrication of the orifices OR20.

Figure 5:
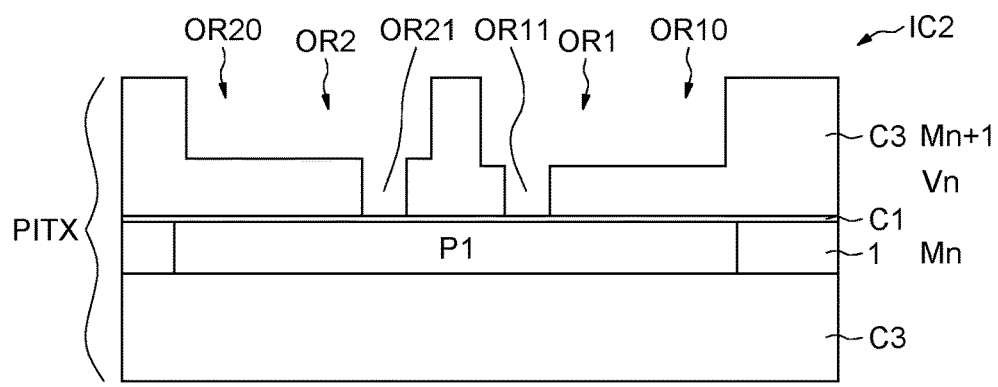
FIGS. 5 to 7 illustrate schematically a second embodiment and implementation.
Figure 6:
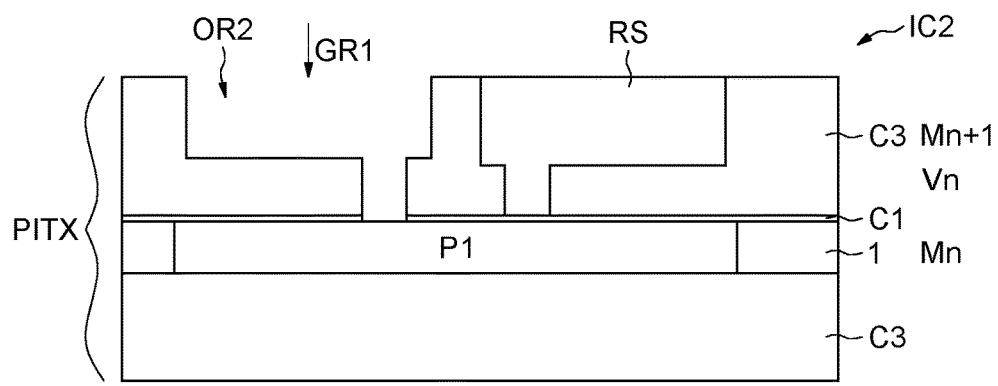
Figure 7:
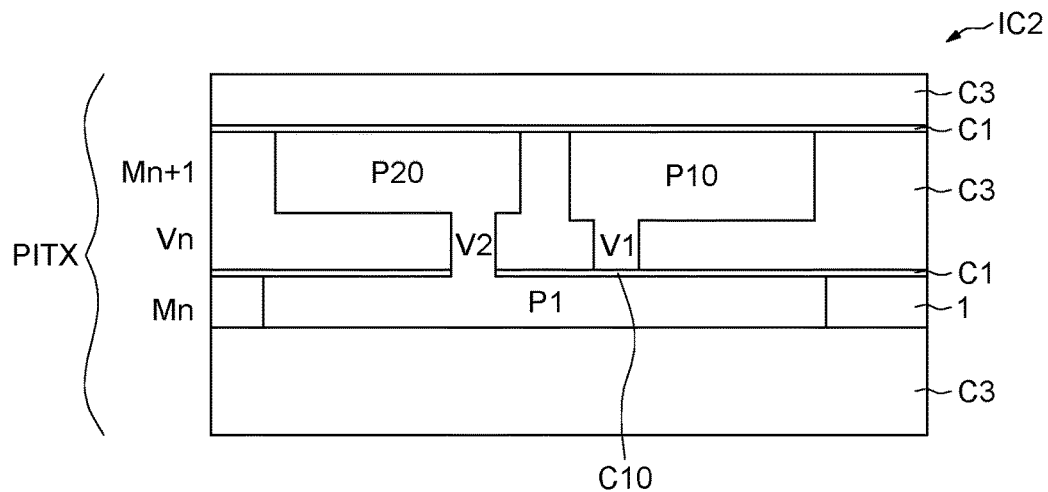

Accordingly, it is possible to use another variant embodiment such as that illustrated schematically in FIGS. 5 to 7.

Here again, in these figures, the substrate SB of the integrated circuit IC2 has not been shown for the sake of simplicity and only one portion of the interconnection part PITX has been represented.

In FIG. 5, the lower metallization level Mn which rests on the lower inter-metal insulating layer C3 here comprises a metal track P1 separated from the other metal tracks of the level Mn by an inter-track insulating region 1.

The metallization level Mn is here again covered by the encapsulation layer C1.

As illustrated in FIG. 5, the inter-metallization level insulating layer C3 (layer IMD) is formed on the encapsulation layer C1, and orifices OR1 OR2 comprising first parts OR10 OR20 designed to receive all the metal tracks of the upper metallization level, together with lower parts OR11 and OR21 designed to receive all the vias of the via level Vn are formed in the inter-level insulating layer C3, in a conventional manner by etching GR1.

All these orifices OR1, OR2 open out onto the top surface of encapsulation layer C1 without penetrating through to the metal track P1.

Then, after having deposited a resist RS in the orifice OR1 (FIG. 6), a localized etching GR1 of the encapsulation layer C1 through to the metal track P1 is carried out through all the orifices, here the orifice OR2, with the exception of course of each part of the encapsulation layer C1 which is protected by the resist RS and which is situated at the location of a future first via V1. The resist RS is then removed.

Then, as illustrated in FIG. 7, the conventional filling of the orifices is carried out with at least one electrically-conductive filler material, for example copper, in such a manner as to form all the vias V1 and V2 of the via level Vn, together with all the metal tracks P10, P20 of the upper metallization level Mn+1.

On the other hand, it can be seen that the first via V1 is not in electrical contact with the underlying metal track P1 owing to the presence of an electrical discontinuity here formed by a part C10 of the encapsulation layer C1.

On the other hand, all the other vias, in this case the via V2, is indeed in electrical contact with the underlying metal track P1 through the encapsulation layer C1.

Here again, this electrical discontinuity C10 has been formed prior to the formation of all the vias and of all the metal tracks of the upper metallization level.

It is also possible to form an electrical discontinuity using another variant embodiment such as that illustrated schematically in FIGS. 8 to 12.

Here again, for the sake of simplicity in these figures, only a portion of the interconnection part PITX of the integrated circuit IC3 has been shown, and the substrate of this integrated circuit IC3 has not been shown.

Figure 8:
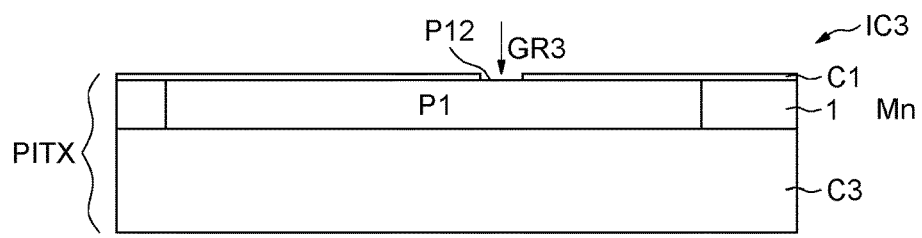
FIGS. 8 to 12 illustrate schematically a third embodiment and implementation.
Figure 9:
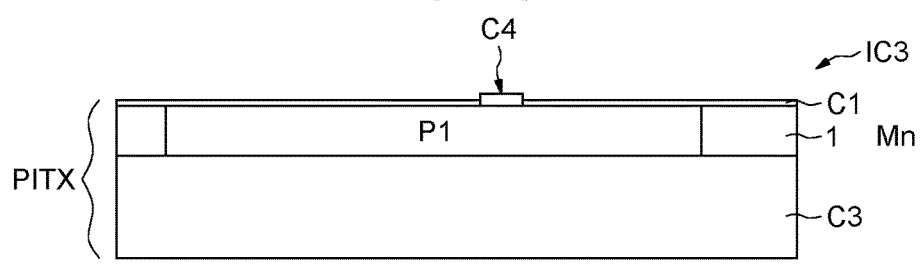

Here again, as illustrated in FIG. 8, the metallization level Mn rests on the lower inter-metal insulating layer C3 and here comprises a metal track P1 covered by the encapsulation layer C1.

Here again, the metal track P1 is separated from the other metal tracks of the lower metallization level Mn by an inter-track insulating region 1.

A localized etching GR3 of the encapsulation layer C1 through to the top surface of the metal track P1 has been carried out at the location of a future first via and at the location of the future electrical discontinuity.

This conventional and known localized etching GR3 allows a region of interruption of the encapsulation layer 1 to be created and a second part P12 of the metal track P1 to be uncovered.

Then, an oxidation of the second part P12 (FIG. 9) is carried out so as to cover this second part with an insulating layer of metal oxide C4.

This oxidation may be carried out for example by means of a solution of hydrogen peroxide $H_2O_2$ or else by means of a fast oxidation using oxygen ("flash $O_2$" oxidation).

Figure 10:
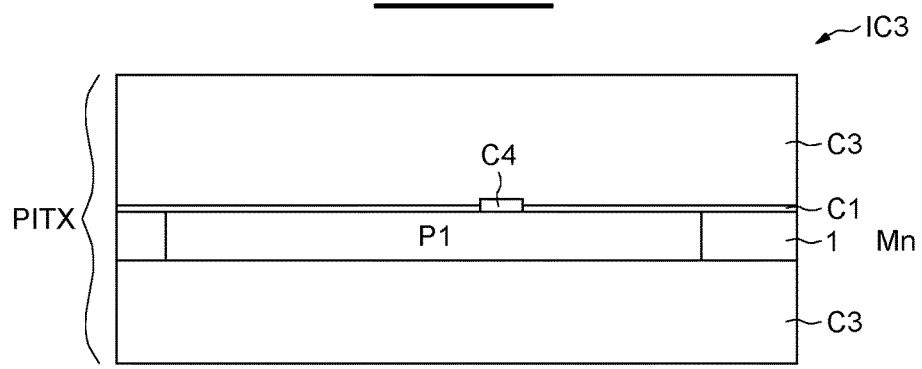

As illustrated in FIG. 10, the inter-level insulating layer C3 is subsequently deposited on the encapsulation layer C1 and on the insulating layer of metal oxide C4.

This layer C3 may for example comprise a material of the SiOC type.

Figure 11:
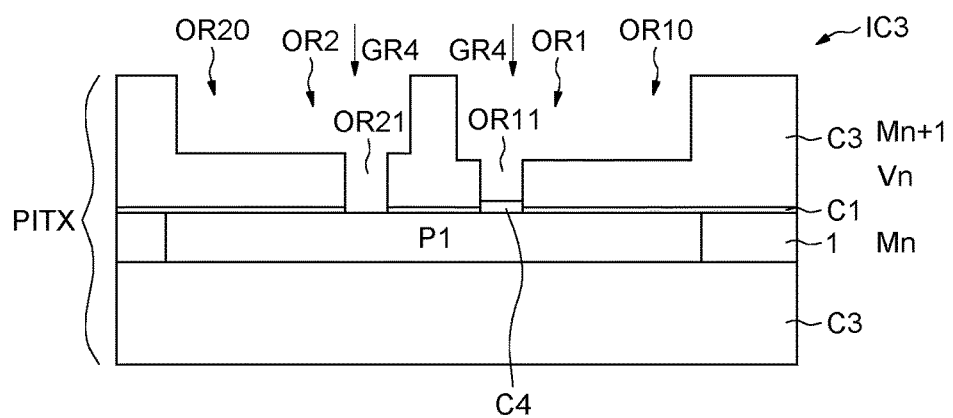

Then, as illustrated in FIG. 11, a conventional and known etching GR4 is carried out in such a manner as to form orifices OR1 and OR2 in the layer C3 comprising parts OR10 and OR20 designed to receive the future metal tracks of the upper metallization level Mn+1 and lower parts OR11 and OR21 designed to receive the future vias of the via level Vn.

It should be noted here that the etching GR4 will etch, through the orifice OR21, the encapsulation layer C1 so as to uncover the top of the metal track P1, but will only etch very partially, or even not at all, the insulating layer of metal oxide C4 owing to the high etch selectivity between the material, for example SiCN, of the encapsulation layer and the metal oxide of the layer C4.

Figure 12:
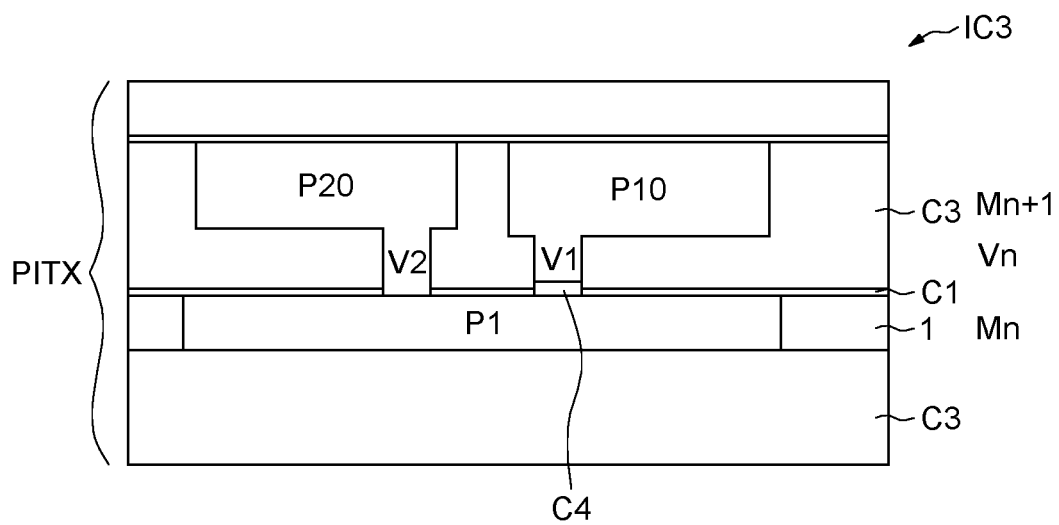

Then, as illustrated in FIG. 12, a conventional filling of the orifices OR1 and OR2 is carried out in such a manner as to form all the vias V1 and V2 of the via level Vn and all the metal tracks P10 and P20 of the upper metallization level Mn+1.

It is accordingly noted that the via V2 comes into electrical contact with the underlying metal track P1 through the encapsulation layer C1, whereas the first via V1 is not in electrical contact with the underlying metal track P1, owing to the presence of the electrical discontinuity C4 formed by the insulating layer of metal oxide filling the region of interruption of the encapsulation layer C1.

Figure 13:
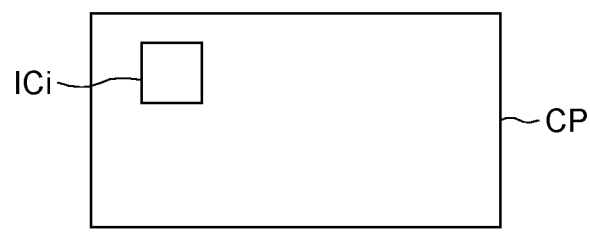
FIG. 13 illustrates schematically a smartcard according to the invention.

Such an integrated circuit ICi, whether this be the integrated circuit IC1, IC2 or IC3, may be incorporated into any object, notably a smartcard CP, as illustrated very schematically in FIG. 13.

The invention claimed is:

1. A method, comprising:
  forming a lower metallization level of an interconnection part of an integrated circuit;

covering the lower metallization level with an insulating encapsulation layer; and forming, at a level of said insulating encapsulation layer, an electrical discontinuity in a via level situated between said lower metallization level and an upper metallization level of said interconnection part, said electrical discontinuity being between a first via of said via level and a first metal track of said lower metallization level;

wherein forming the electrical discontinuity is performed prior to forming any vias at the via level and prior to forming any metal tracks of the upper metallization level.

2. The method according to claim 1, wherein forming the electrical discontinuity comprises:

forming, at a location of the first via, an orifice passing through said insulating encapsulation layer and extending into a part of the first metal track;

forming a first insulating layer covering said encapsulation layer and coating an internal wall and a bottom of said orifice, said first insulating layer in the orifice providing said electrical discontinuity;

forming, on said first insulating layer, a second insulating layer; and forming, within the second insulating layer, the first insulating layer and the insulating encapsulation layer, of all vias of the via level and of metal tracks of the upper metallization level, wherein the first via of said vias is separated from the first metal track by the electrical discontinuity, and wherein vias of than the first via are in electrical with corresponding metal tracks of the lower metallization level.

3. The method according to claim 1, wherein forming the electrical discontinuity comprises:

forming, on said insulating encapsulation layer, an inter-metallization level insulating layer;

forming, within said inter-metallization level insulating layer, orifices for all the vias of the via level and all metal tracks of the upper metallization level, said orifices opening out onto a top surface of said insulating encapsulation layer;

locally etching through said insulating encapsulation layer at said orifices except for at a location of the first via, wherein a first part of the insulating encapsulation layer that is not locally etched forms the electrical discontinuity; and filling said orifices with an electrically-conductive filler material so as to form all the vias of the via level and all the metal tracks of the upper metallization level;

wherein the first via is separated from the first metal track by the electrical discontinuity.

4. The method according to claim 1, wherein forming the electrical discontinuity comprises:

locally etching, at the location of the first via, a first part of said insulating encapsulation layer so as to uncover a top surface of the first metal track;

oxidizing the top surface of the first metal track to produce an insulating layer of metal oxide that forms said corresponding electrical discontinuity;

forming, on said insulating encapsulation layer and on the insulating layer of metal oxide, an inter-metallization level insulating layer;

forming, within said inter-metallization level insulating layer, orifices for all vias of the via level and all metal tracks of the upper metallization level, said orifices opening out onto a top surface of corresponding metal tracks of said first metallization layer except for at a location of the first via where the orifice opens out onto a top surface of the insulating layer of metal oxide; and filling all the orifices with an electrically-conductive filler material so as to form all vias of the via level and all metal tracks of the upper metallization level, wherein said first via is separated from the first metal track by the electrical discontinuity.

5. An integrated circuit, comprising:

an interconnection part including a via level situated between a lower metallization level and an upper metallization level, said lower metallization level covered by an insulating encapsulation layer; and an electrical discontinuity between a first via of said via level and a first metal track of said lower metallization level, wherein said electrical discontinuity is situated at a level of said insulating encapsulation layer.

6. The integrated circuit according to claim 5, comprising, at a location of the first via:

an orifice passing through said insulating encapsulation layer and extending into a part of the first metal track;

a first insulating layer coating an internal wall and a bottom of said orifice;

wherein a part of said the first insulating layer forms the electrical discontinuity separating the first via from the first metal track; and other vias of the via level extending through said insulating encapsulation layer that are in electrical contact with corresponding metal tracks of the lower metallization level.

7. The integrated circuit according to claim 5, wherein the first via is separated from the first metal track by a first part of the insulating encapsulation layer that forms the electrical discontinuity, and further comprising other vias of the via level extending through said insulating encapsulation layer that are in electrical contact with corresponding metal tracks of the lower metallization level.

8. The integrated circuit according to claim 5, comprising, at the location of each first via:

a region of interruption of the insulating encapsulation layer;

an insulating layer of metal oxide within said region and covering a part of the first metal track, said first via separated from the part of the first metal track by the insulating layer of metal oxide that forms the electrical discontinuity; and other vias of the via level extending through said insulating encapsulation layer and in electrical contact with corresponding metal tracks of the lower metallization level.

9. The integrated circuit according to claim 5, wherein the integrated circuit is a component of an object.

10. The integrated circuit according to claim 9, wherein the object is a smartcard.

* * * * *